United States Patent
Odnoblyudov et al.

(10) Patent No.: US 8,809,897 B2
(45) Date of Patent: Aug. 19, 2014

(54) SOLID STATE TRANSDUCER DEVICES, INCLUDING DEVICES HAVING INTEGRATED ELECTROSTATIC DISCHARGE PROTECTION, AND ASSOCIATED SYSTEMS AND METHODS

(75) Inventors: Vladimir Odnoblyudov, Eagle, ID (US); Martin F. Schubert, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 13/223,098

(22) Filed: Aug. 31, 2011

(65) Prior Publication Data

US 2013/0049059 A1 Feb. 28, 2013

(51) Int. Cl.
*H01L 33/00* (2010.01)

(52) U.S. Cl.
USPC .................. 257/99; 257/E33.062; 438/23

(58) Field of Classification Search
None
See application file for complete search history.

(56) References Cited

U.S. PATENT DOCUMENTS

| | | |
|---|---|---|
| 3,851,291 A | 11/1974 | Sommer |
| 5,216,404 A | 6/1993 | Nagai et al. |
| 5,914,501 A | 6/1999 | Antle et al. |
| 5,917,534 A | 6/1999 | Rajeswaran |
| 7,064,353 B2 | 6/2006 | Bhat |
| 7,528,422 B2 | 5/2009 | Murphy |
| 7,589,350 B2 | 9/2009 | Chen et al. |
| 7,649,208 B2 | 1/2010 | Lee et al. |
| 7,683,383 B2 | 3/2010 | Hong et al. |
| 7,714,348 B2 | 5/2010 | Fan et al. |
| 2006/0006404 A1 | 1/2006 | Ibbetson et al. |
| 2010/0019264 A1 | 1/2010 | Jeong |
| 2010/0207127 A1 | 8/2010 | Chen |
| 2010/0295087 A1 | 11/2010 | Baek et al. |

FOREIGN PATENT DOCUMENTS

KR 20100011116 A 2/2010

OTHER PUBLICATIONS

Atwater Jr., H.A., Ion Beam Enhanced Grain Growth in Thin Films, RLE Technical Report No. 527, Massachusetts Institute of Technology, Research Laboratory of Electronics, pp. 1-224, Mar. 1987.
Atwater, H.A. et al., Mechanisms for Crystallographic Orientation in the Crystallization of Thin Silicon Films from the Melt, J. Mater. Res., vol. 3, No. 6, pp. 1232-1237, Nov./Dec. 1988.
Atwater, H.A. et al., Zone-Melting Recrystallization of Thick Silicon on Insulator Films, Materials Letters, vol. 2, No. 4A, pp. 269-273, Mar. 1984.
Choi, J.-H. et al. Zone Melting Recrystallization of Polysilicon by a Focused-Lamp with Unsymmetric Trapezoidal Power Distribution, Journal of Electronic Materials, vol. 20, No. 3, pp. 231-235, Mar. 1991.
Colinge, J.-P., Silicon-on-Insulator Technology: Materials to VLSI, 2nd Edition, pp. 16-27 and 52-65, Sep. 1997.

(Continued)

*Primary Examiner* — Sonya D McCall Shepard
(74) *Attorney, Agent, or Firm* — Perkins Coie LLP

(57) ABSTRACT

Solid state transducer devices having integrated electrostatic discharge protection and associated systems and methods are disclosed herein. In one embodiment, a solid state transducer device includes a solid state emitter, and an electrostatic discharge device carried by the solid state emitter. In some embodiments, the electrostatic discharge device and the solid state emitter share a common first contact and a common second contact. In further embodiments, the solid state lighting device and the electrostatic discharge device share a common epitaxial substrate. In still further embodiments, the electrostatic discharge device is positioned between the solid state lighting device and a support substrate.

16 Claims, 8 Drawing Sheets

(56) References Cited

OTHER PUBLICATIONS

Geis, M.W. et al., (Invited) Silicon Graphoepitaxy, Proceedings of the 12th Conference on Solid State Devices, Tokyo 1980, Japanese Journal of Applied Physics, vol. 20, Supplement 20-1, pp. 39-42, 1981.

Geis, M.W. et al., Grapho-Epitaxy of Silicon on Fused Silica using Surface Micropatterns and Laser Crystallization, J. Vac. Sci. Technol., vol. 16, No. 6, pp. 1640-1643, Nov./Dec. 1979.

Geis, M.W. et al., Summary Abstract: Silicon Graphoepitaxy, J. Vac. Sci. Technol., vol. 18, No. 2, pp. 229-230, Mar. 1981.

Geis, M.W. et al., Zone-Melting Recrystallization of Si Films with a Moveable-Strip-Heater Oven, J. Electrochem. Soc.: Solid State Science and Technology, vol. 129, No. 12, pp. 2812-2818, Dec. 1982.

Givargizov, E.I., Graphoepitaxy as an Approach to Oriented Crystallization on Amorphous Substrates, Journal of Crystal Growth, vol. 310, No. 7-9, pp. 1686-1690, Apr. 2008.

Klykov, V.I. et al. Artificial Epitaxy (Diataxy) of Silicon and Germanium, Acta Physica Academiae Scientiarum Hungaricae, vol. 47, Nos. 1-3, pp. 167-183, Mar. 1979.

Minagawa, Y. et al. Fabrication of (111)-Oriented Si Film with a Ni/Ti Layer by Metal Induced Crystallization, Jpn. J. Appl. Phys., vol. 20, Part 2, No. 3A, pp. L186-L188, Mar. 2001.

Moon, B.Y. et al. Study on the Polycrystalline Silicon Films Deposited by Inductively Coupled Plasma Chemical Vapor Deposition, Mat. Res. Soc. Symp. Proc., vol. 685E, pp. D5.2.1-D5.2.6, 2001.

Naomoto, H. et al., Characterization of Thin-Film Silicon Formed by High-Speed Zone-Melting Recrystallization Process, Solar Energy Materials and Solar Cells, vol. 48, Nos. 1-4, pp. 261-267, Nov. 1997.

Pauli, M. et al., Large Area and Rapid Thermal Zone Melting Crystallization of Silicon Films on Graphite Substrates for Photovoltaic Use, Conference Record of the 23rd IEEE Photovoltaic Specialists Conference, pp. 195-200, May 1993.

Scharff, W. et al., Flash-Lamp-Induced Crystal Growth of Silicon on Amorphous Substrates Using Artificial Surface-Relief Structures, Physica Status Solidi (a), vol. 74, No. 2, pp. 545-552, Dec. 1982.

Wan, J. et al., Growth of Crack-Free Hexagonal GaN Films on Si(100), Applied Physics Letters, vol. 79, No. 10, pp. 1459-1461, Sep. 2001.

Yoon, S.M. et al., Numerical Simulation of Scanning Speed and Supercooling Effects During Zone-Melting-Recrystallization of SOI Wafers, Mat. Res. Soc. Symp. Proc., vol. 205, pp. 453-458, 1990.

Bikgi, L. et al., "Integrated Optical Proximity Sensor Based on Organic Photodiodes and organic LEDs", Proc. SPIE 5961, 596104 (2005), doi:10.1117/12.628140.

Moridi, M. et al., "An Amorphous Silicon Photodiode Array for Glass-Based Optical MEMS Application", IEEE Sensors 2009, pp. 1604-1608, Oct. 2009, doi:10.1109/ICSENS.2009.5398496.

Nanotechweb.org, Nanoparticle Film Turns LED into Portable Ozone Sensor, 2 pages, Oct. 11, 2007, retrieved from the Internet, URL: http://nanotechweb.org/cws/article/tech/31446.

Sato, Y. et al., "A Method of Preparing Thin-Film Micro-PTC Thermistors Based on BaTiO3 Using YAG-Laser Irradiation", Electronics and Communications in Japan, Part 2, vol. 85, No. 11, pp. 25-31, Nov. 2002, doi:10.1002/ecjb.1113.

Urban, G. et al., "High-Resolution Thin-Film Temperature Sensor Arrays for Medical Applications", Sensors and Actuators A: Physical, vol. 22, Nos. 1-3, pp. 650-654, Jun. 1989, doi:10.1016/0924-4247(89)80051-2.

Wang, X.X. et al., "All-Thin-Film GeAu Thermistors for Particle Detection", Journal of Low Temperature Physics, vol. 93, Nos. 3-4, pp. 349-354, Nov. 1993, doi:10.1007/BF00693445.

Wronski, C.R. and D.E. Carlson, "Surface States and Barrier Heights of Metal-Amorphous Silicon Schottky Barriers", Solid State Communications, vol. 23, No. 7, pp. 421-424, Aug. 1977, doi:10.1016/0038-1098(77)90999-1.

International Search Report and Written Opinion issued Feb. 28, 2013 in International Application No. PCT/US2012/050866, 8 pages.

SOLID STATE TRANSDUCER DEVICES, INCLUDING DEVICES HAVING INTEGRATED ELECTROSTATIC DISCHARGE PROTECTION, AND ASSOCIATED SYSTEMS AND METHODS

TECHNICAL FIELD

The present technology is directed generally to solid state transducer devices including devices having integrated electrostatic discharge protection, and associated systems and methods.

BACKGROUND

Solid state lighting ("SSL") devices are used in a wide variety of products and applications. For example, mobile phones, personal digital assistants ("PDAs"), digital cameras, MP3 players, and other portable electronic devices utilize SSL devices for backlighting. SSL devices are also used for signage, indoor lighting, outdoor lighting, and other types of general illumination. SSL devices generally use light emitting diodes ("LEDs"), organic light emitting diodes ("OLEDs"), and/or polymer light emitting diodes ("PLEDs") as sources of illumination, rather than electrical filaments, plasma, or gas. FIG. 1 is a schematic cross-sectional diagram of a conventional indium-gallium nitride (InGaN) LED 10 including a substrate material 12 (e.g., silicon), N-type gallium nitride (GaN) 14, GaN/InGaN multiple quantum wells ("MQWs") 16, and P-type GaN 18. The LED 10 also includes a first contact 20 on the P-type GaN 18 and a second contact 22 on the N-type GaN 14. During manufacturing, the N-type GaN 14, the GaN/InGaN MQWs 16, and the P-type GaN 18 are formed on the substrate material 12 via metal organic chemical vapor deposition ("MOCVD"), molecular beam epitaxy ("MBE"), liquid phase epitaxy ("LPE"), hydride vapor phase epitaxy ("HVPE"), and/or other epitaxial growth techniques, each of which is typically performed at elevated temperatures.

One aspect of the LED 10 shown in FIG. 1 is that an electrostatic discharge ("ESD") event can cause catastrophic damage to the LED 10, and render the LED 10 inoperable. Accordingly, it is desirable to reduce the effects of ESD events. However, conventional approaches for mitigating the effects of ESD typically include connecting a protection diode to the SSL device, which requires additional connection steps and can compromise the electrical integrity of the resulting structure. Accordingly, there remains a need for reliably and cost-effectively manufacturing LEDs with suitable protection against ESD.

DETAILED DESCRIPTION

Specific details of several embodiments of representative SST devices and associated methods of manufacturing SST devices are described below. The term "SST" generally refers to solid-state transducer devices that include a semiconductor material as the active medium to convert electrical energy into electromagnetic radiation in the visible, ultraviolet, infrared, and/or other spectra. For example, SSTs include solid-state light emitters (e.g., LEDs, laser diodes, etc.) and/or other sources of emission other than electrical filaments, plasmas, or gases. In other embodiments, SSTs can include solid-state devices that convert electromagnetic radiation into electricity. The term solid state emitter ("SSE") generally refers to the solid state components or light emitting structures that convert electrical energy into electromagnetic radiation in the visible, ultraviolet, infrared, and/or other spectra. SSEs include semiconductor LEDs, PLEDs, OLEDs, and/or other types of solid state devices that convert electrical energy into electromagnetic radiation in a desired spectrum. Particular examples of the presently disclosed technology are described below in the context of solid state lighting (SSL) devices which represent a particular type of SST device. In other embodiments, the disclosed technology is applied to other SST devices. A person skilled in the relevant art will understand that the new, presently disclosed technology may have additional embodiments and that this technology may be practiced without several of the details of the embodiments described below with reference to FIGS. 2-5B.

In particular embodiments, an electrostatic discharge device is formed on a solid state emitter without pre-forming the electrostatic discharge device as a stand-alone unit, and then electrically and/or physically attaching the electrostatic discharge device as a unit to the SSE. Accordingly, forming an electrostatic discharge device on a solid state emitter can include forming the electrostatic discharge device directly on a semiconductor surface of the solid state emitter, or on an intermediate surface, for example, a conductive and/or reflective surface. In particular embodiments, both the solid state emitter and the electrostatic discharge device are formed from the same epitaxial substrate. In other embodiments, the solid state emitter can be formed on an epitaxial substrate, and the electrostatic discharge device can be formed on the solid state emitter, with the epitaxial substrate removed before the resulting SSL device is completed for final use.

Figure 1:
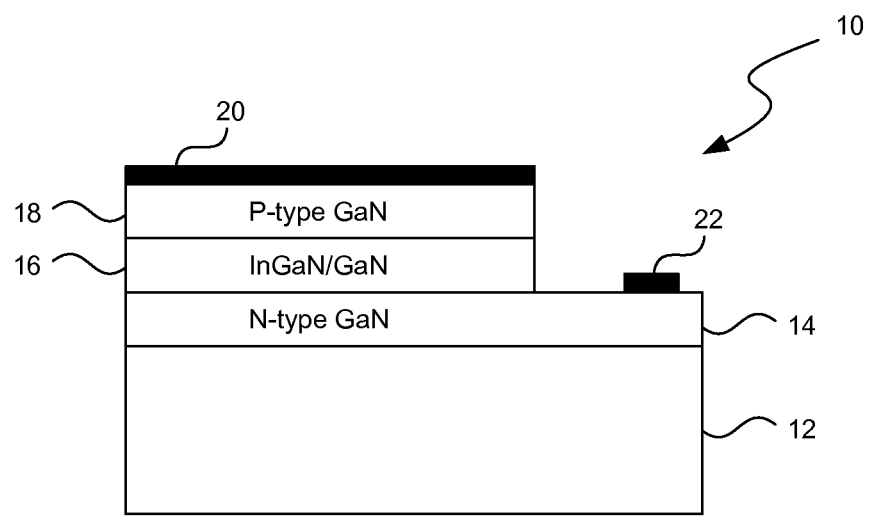
FIG. 1 is a cross-sectional view of a portion of a light emitting diode configured in accordance with the prior art.
Figure 2:
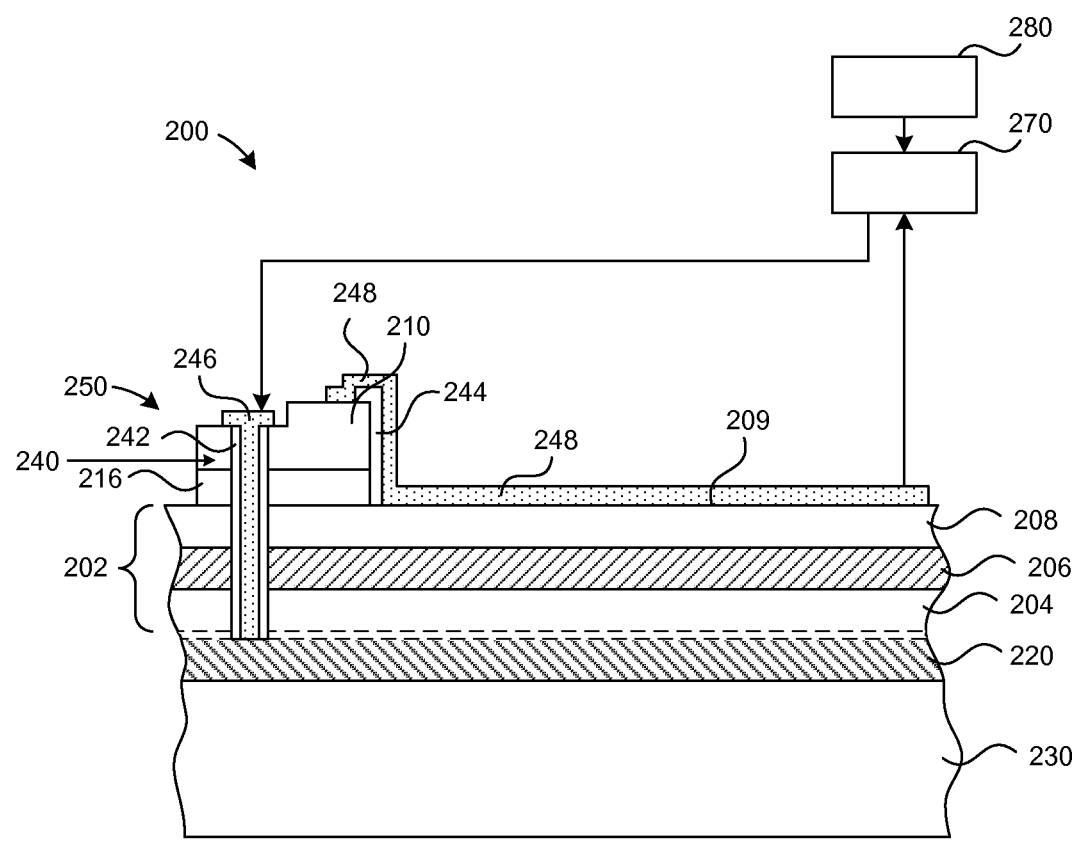
FIG. 2 is a cross-sectional view of an SSL device having an electrostatic discharge device, configured and integrated in accordance with embodiments of the presently disclosed technology.

FIG. 2 is a cross-sectional view of an SSL device 200 configured in accordance with embodiments of the presently disclosed technology. The SSL device 200 can include an SSE 202 mounted to or otherwise carried by a support substrate 230. The SSL device 200 further includes an electrostatic discharge device 250 carried by the SSE 202. As will be described further below, the electrostatic discharge device 250 can be manufactured to be integral with the SSL device 200 (and in particular, the SSE 202) e.g., to improve reliability and/or manufacturability.

The SSE 202 can include a first semiconductor material 204, a second semiconductor material 208, and an active region 206 between the first and second semiconductor materials 204, 208. In one embodiment, the first semiconductor material 204 is a P-type gallium nitride ("GaN") material, the active region 206 is an indium gallium nitride ("InGaN") material, and the second semiconductor material 208 is an N-type GaN material. In other embodiments, the semiconductor materials of the SSE structure 202 can include at least one of gallium arsenide ("GaAs"), aluminum gallium arsenide ("AlGaAs"), gallium arsenide phosphide ("GaAsP"), aluminum gallium indium phosphide (AlGaInP), gallium(III) phosphide ("GaP"), zinc selenide ("ZnSe"), boron nitride ("BN"), aluminum nitride ("AlN"), aluminum gallium nitride ("AlGaN"), aluminum gallium indium nitride ("AlGaInN"), and/or another suitable semiconductor material.

The illustrated electrostatic discharge device 250 includes an epitaxial substrate 210 (e.g., an epitaxial growth substrate) and a semiconductor material 216 (e.g., a buffer material). The electrostatic discharge device 250 further includes a first contact 246 (e.g., formed from a first conductive material) electrically connected to a via 240 that extends through the electrostatic discharge device 250 and a portion of the SSE 202. The first contact 246 electrically contacts a conductive (and typically reflective) material 220 below the active region 206 and can provide an external terminal for interfacing with a power source or sink. Accordingly, the conductive material 220 operates as a P-contact. The first contact 246 is electrically insulated in the via 240 from the surrounding semiconductor material 216 and portions of the SSE 202 by an insulator 242. The illustrated electrostatic discharge device 250 further includes a second contact 248 (e.g., formed from a second conductive material) that doubles as an N-contact for the SSE 202. Accordingly, the second contact 248 can extend over an upper surface 209 of the SSE 202 e.g., in contact with the N-type material 208. The second contact 248 is electrically insulated from the semiconductor material 216 by a second insulator 244, and is transparent to allow radiation (e.g., visible light) to pass out through the SSL device 200 from the active region 206. In the illustrated embodiment, the first contact 246 and the second contact 248 are shared by the SSE 202 and the electrostatic discharge device 250. More specifically, the first contact 246 is electrically coupled to both the first semiconductor layer 204 of the SSE 202 and the epitaxial substrate 210 of the electrostatic discharge device 250. The second contact 248 is electrically coupled to both the second semiconductor layer 208 of the SSE 202 and the epitaxial substrate 210 of the electrostatic discharge device 250. Accordingly, the electrostatic discharge device 250 is connected in parallel with the SSE 202. The conductive materials forming the first contact 246, the second contact 248 and an electrical path though the via 240 can be the same or different, depending upon the particular embodiment. For example, the via 240 can include a third conductive material that is the same as the first conductive material, though it may be deposited in a separate step.

The SSL device 200 can be coupled to a power source 270 that is in turn coupled to a controller 280. The power source 270 provides electrical current to the SSL device 200, under the direction of the controller 280.

During normal operation, as current flows from the first semiconductor material 204 to the second semiconductor material 208, charge-carriers flow from the second semiconductor material 208 toward the first semiconductor material 204 and cause the active region 206 to emit radiation. The radiation is reflected outwardly by the conductive, reflective material 220. The electrostatic discharge device 250 provides an additional path for current to flow between the first contact 246 and the second contact 248. In particular, the epitaxial substrate 210 between the first contact 246 and the second contact 248 can form a diode in parallel with the SSE 202, but with the opposite polarity. During normal operating conditions, the bias of the epitaxial substrate 210 prevents current flow through it from the first contact 246 to the second contact 248, forcing the current to pass through the SSE 202. If a significant reverse voltage is placed across the contacts 246, 248, (e.g., during an electrostatic discharge event), the epitaxial substrate 210 becomes highly conductive in the reverse direction, allowing the reverse current to flow through it, thus protecting the SSL device from the reverse current flow.

The present technology further includes methods of manufacturing SSL devices. For example, one method of forming a SSL device can include forming an SSE and an electrostatic discharge device from a common epitaxial substrate. Representative steps for such a process are described in further detail below with reference to FIGS. 3A-3G.

Figure 3A:
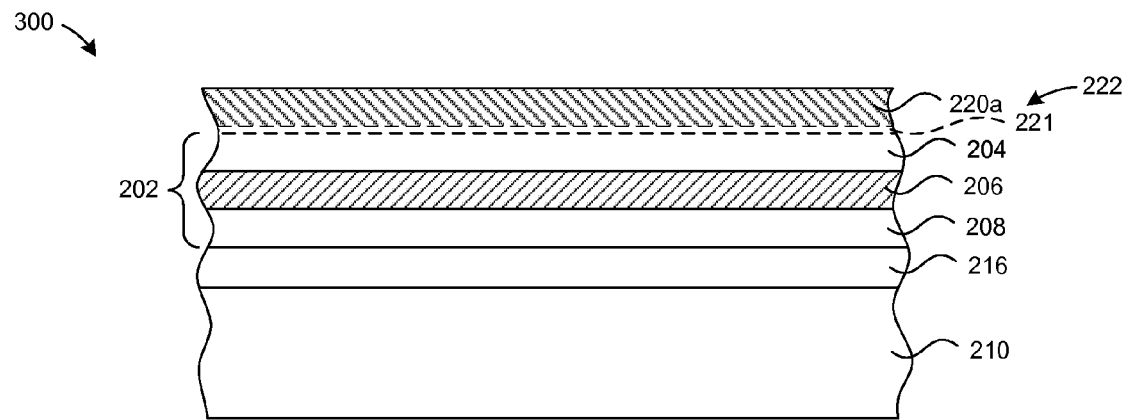
FIGS. 3A-3G are cross-sectional views of a portion of a microelectronic substrate undergoing a process of forming an SSL device and an associated electrostatic discharge device in accordance with embodiments of the presently disclosed technology.

FIGS. 3A-3G are partially schematic, cross-sectional views of a portion of a microelectronic substrate 300 undergoing a process of forming an embodiment of the SSL device 200 described above, in accordance with embodiments of the technology. FIG. 3A shows the substrate 300 after a semiconductor material 216 (e.g., a buffer material) has been disposed on the epitaxial substrate 210 (e.g., a growth substrate). The epitaxial substrate 210 can be silicon (e.g., Si (1,0,0) or Si (1,1,1)), GaAs, silicon carbide (SiC), polyaluminum nitride ("pAlN"), engineered substrates with silicon epitaxial surfaces (e.g., silicon on polyaluminum nitride), and/or other suitable materials. The semiconductor material 216 can be the same material as the epitaxial substrate 210 or a separate material bonded to the epitaxial substrate 210. For example, the epitaxial substrate 210 can be pAlN and the semiconductor material 216 can be Si (1,1,1). In any of these embodiments, the SSE 202 is formed on the semiconductor material 216.

The SSE 202 includes the first semiconductor material 204, the active region 206, and the second semiconductor material 208, which can be sequentially deposited or otherwise formed using chemical vapor deposition ("CVD"), physical vapor deposition ("PVD"), atomic layer deposition ("ALD"), plating, or other techniques known in the semiconductor fabrication arts. In the embodiment shown in FIG. 3A, the second semiconductor material 208 is grown or formed on the semiconductor material 216, the active region 206 is grown or formed on the second semiconductor material 208, and the first semiconductor material 204 is grown or formed on the active region 206. In one embodiment, N-type GaN (as described above with reference to FIG. 2) is positioned proximate to the epitaxial substrate 210, but in other embodiments P-type GaN is positioned proximate to the epitaxial substrate 210. In other embodiments, the SSE 202 can include additional buffer materials, stress control materials, or other materials, and the materials can have other arrangements known in the art.

In the embodiment shown in FIG. 3A, a conductive, reflective material 220a is formed over the first semiconductor material 204. The conductive, reflective material 220a can be silver (Ag), gold (Au), gold-tin (AuSn), silver-tin (AgSn), copper (Cu), aluminum (Al), or any other suitable material that can provide electrical contact and reflect light emitted from the active region 206 back through the first semiconductor material 204, the active region 206, and the second semiconductor material 208, as described above with reference to FIG. 2. The conductive, reflective material 220a can be selected based on its thermal conductivity, electrical conductivity, and/or the color of light it reflects. For example, silver generally does not alter the color of the reflected light. Gold, copper, or other colored reflective materials can affect the color of the light and can accordingly be selected to produce a desired color for the light emitted by the SSE 202. The conductive, reflective material 220a can be deposited directly on the first semiconductor material 204, or a transparent electrically conductive material 221 (shown in broken lines)

can be disposed between the first semiconductor material 204 and the reflective material 220a. The transparent electrically-conductive material 221 can be indium tin oxide (ITO) or any other suitable material that is transparent, electrically conductive, and adheres or bonds the reflective material 220a to the first semiconductor material 204. The transparent, electrically conductive material 221 and the reflective material 220a can be deposited using CVD, PVD, ALD, plating, or other techniques known in the semiconductor fabrication arts. The transparent, electrically conductive material 221 and/or the reflective material 220a can accordingly form a conductive structure 222 adjacent to (e.g., in contact with) the SSE 202.

Figure 3B:
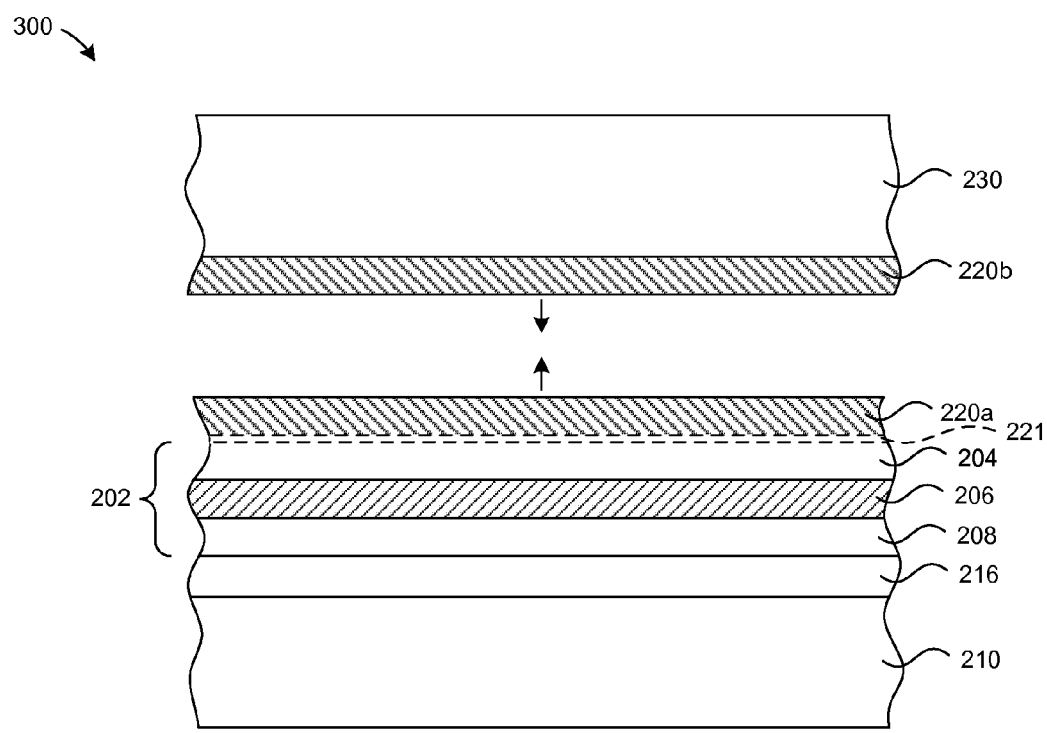

FIG. 3B illustrates an embodiment of a support substrate 230 being bonded or otherwise attached to the SSE 202. The support substrate 230 can include an optional backside reflective material 220b. The backside reflective material 220b is bonded or otherwise attached to the reflective material 220a using an elevated pressure and/or elevated temperature process.

Figure 3C:
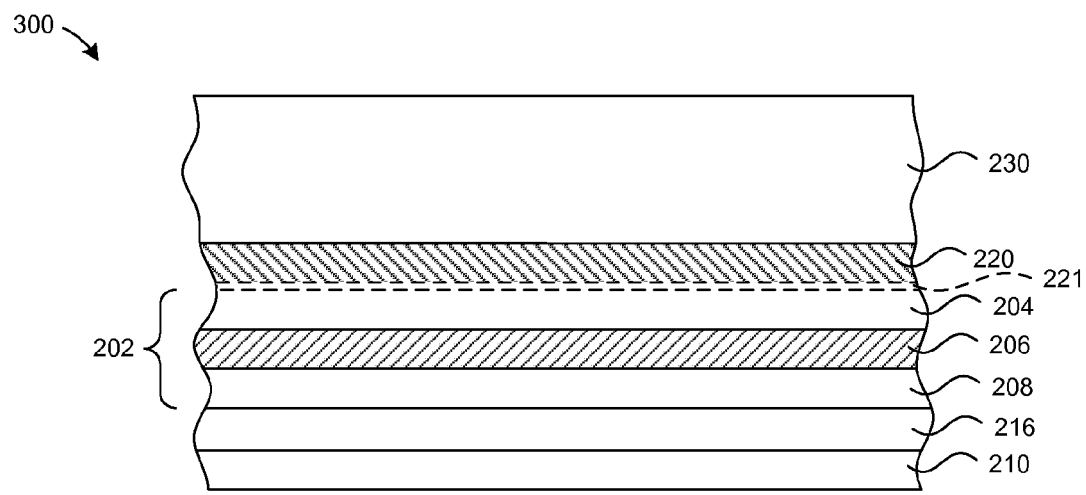

FIG. 3C shows an embodiment in which the bonded reflective materials 220a, 220b (FIG. 3B) form a combined reflective material 220. The epitaxial substrate 210 has also been thinned, e.g., by backgrinding. At this point, the remaining epitaxial substrate 210 can be implanted with a p-type dopant (e.g., boron) to form a p-n junction with the underlying silicon or other semiconductor material 216. In another embodiment, the substrate 210 can be doped in a prior step. In either embodiment, because the semiconductor material 216 typically includes buffer layers to facilitate forming the SSE 202, and because the buffer layers typically include undoped, large-bandgap semiconductor layers (e.g., GaN, AlGaN or AlN) the p-n junction will be electrically isolated from the epitaxial junction that forms the SSE 202.

Figure 3D:
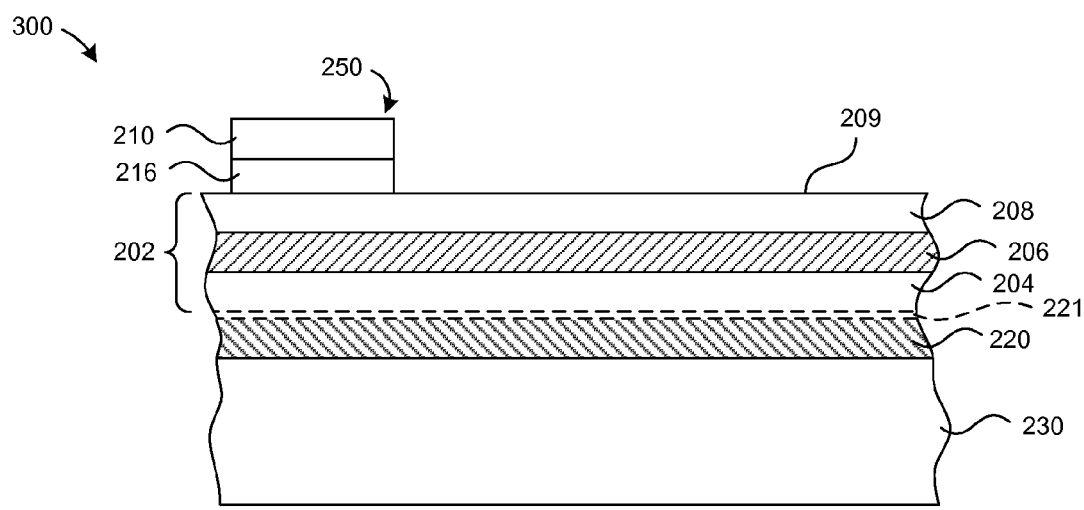

FIG. 3D illustrates the microelectronic substrate 300 after backgrinding, after the substrate 300 has been inverted, and after the epitaxial substrate 210 has been doped. Most of the semiconductor material 216 and the epitaxial substrate 210 have been removed using grinding, etching, and/or other processes to expose an outer surface 209 of the second semiconductor material 208 or other portions of the SSE 202. A portion of the semiconductor material 216 and the epitaxial substrate 210 remain on the SSE 202 to form the electrostatic discharge device 250. This is one manner in which the electrostatic discharge device 250 can be made integral with the SSE 202 and the SSL 300. In further embodiments, the same or similar techniques can be used to form multiple electrostatic discharge devices 250 integral with the SSE 202 e.g., after the surface 209 has been selectively etched or otherwise treated.

Figure 3E:
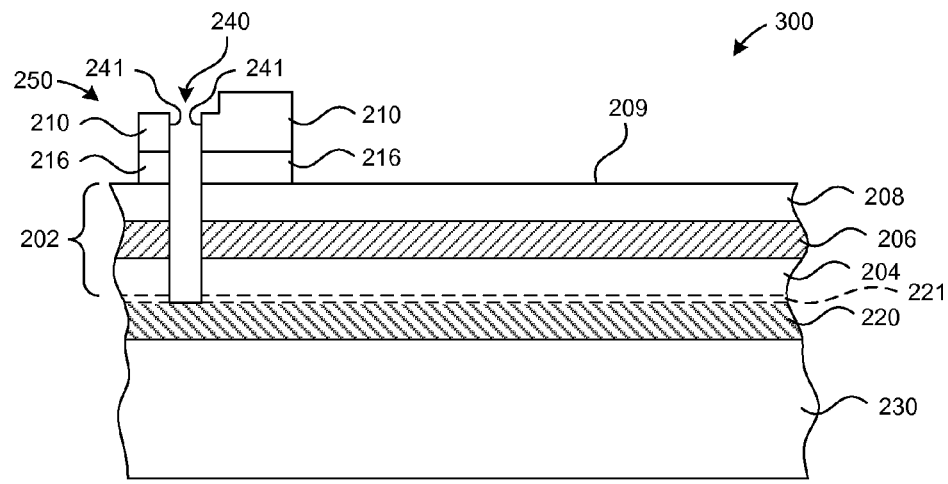
Figure 3F:
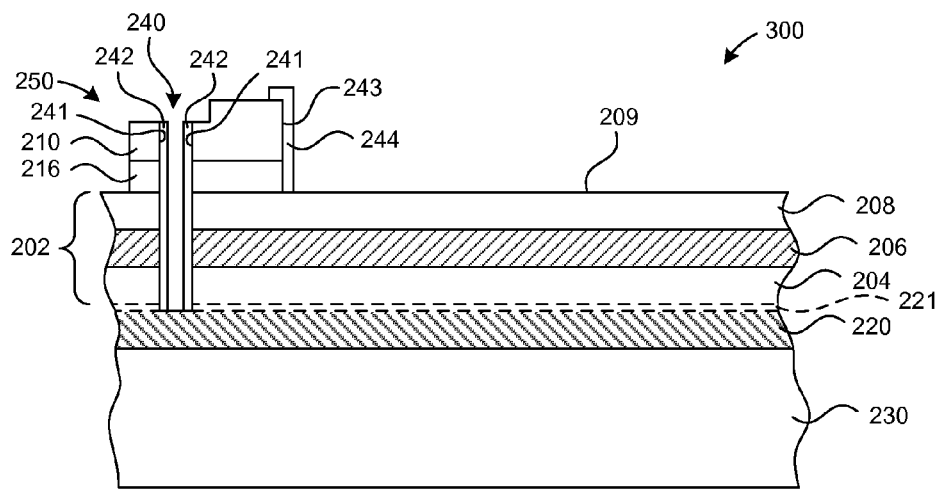

FIG. 3E illustrates the microelectronic substrate 300 after a via 240 has been formed through the electrostatic discharge device 250 and a portion the SSE 202. The via 240 can be formed by drilling, etching, or other techniques known in the semiconductor fabrication arts. The via 240 includes sidewalls 241 and provides access to the reflective material 220 which is in electrical communication with the first semiconductor material 204. In other embodiments, the via 240 provides access to the conductive material 221, which is in direct electrical contact with the first semiconductor material 204. FIG. 3F shows the microelectronic substrate 300 after a first insulator 242 has been deposited or formed in the via 240 and the second insulator 244 has been deposited or formed on a lateral sidewall of the electrostatic discharge device 250.

Figure 3G:
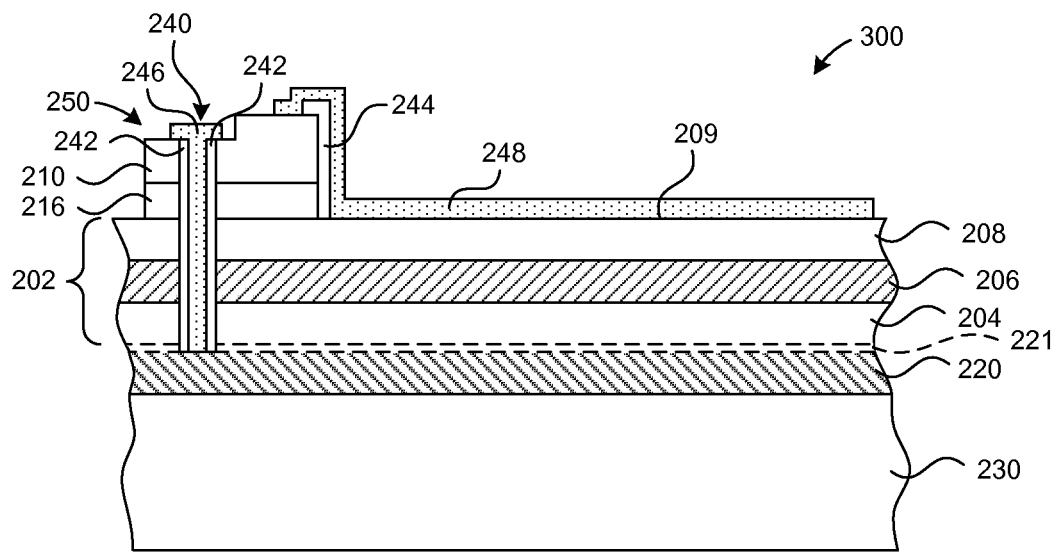

FIG. 3G shows the microelectronic substrate 300 after conductive material has been deposited or formed in the via 240 inward of the first insulator 242, and the first contact 246 has been formed. The first contact 246 can comprise silver (Ag), gold (Au), gold-tin (AuSn), silver-tin (AgSn), copper (Cu), aluminum (Al), and/or other conductive materials. The first contact 246 is insulated from the semiconductor material 216 and the SSE 202 by the first insulator 242. The second contact 248 has been deposited or otherwise disposed or formed on the outer surface 209 of the SSE 202 and on the epitaxial substrate 210 of the electrostatic discharge device 250. The second insulator 244 insulates the second contact 248 from the semiconductor material 216.

In selected embodiments, a lens (not shown in FIG. 3G) can be formed over the SSE 202. The lens can include a light-transmissive material made from silicone, polymethylmethacrylate (PMMA), resin, or other materials with suitable properties for transmitting the radiation emitted by the SSE 202. The lens can be positioned over the SSE 202 such that light emitted by the SSE 202 and reflected by the reflective material 220 passes through the lens. The lens can include various optical features, such as a curved shape, to diffract or otherwise change the direction of light emitted by the SSE 202 as it exits the lens.

Embodiments of the integral electrostatic discharge device 250 offers several advantages over traditional systems. For example, because in particular embodiments the electrostatic discharge device 250 is comprised of materials (e.g., the epitaxial substrate 210 and the semiconductor material 216) that are also used to form the SSE 202, the material cost can be less than that of separately-formed electrostatic devices. Moreover, traditional systems having a separate electrostatic discharge die require additional pick-and-place steps to place the die proximate to the SSE 202. Still further, such traditional systems require forming additional and/or separate electrical connections to connect the electrostatic device to the SSE.

Figure 4:
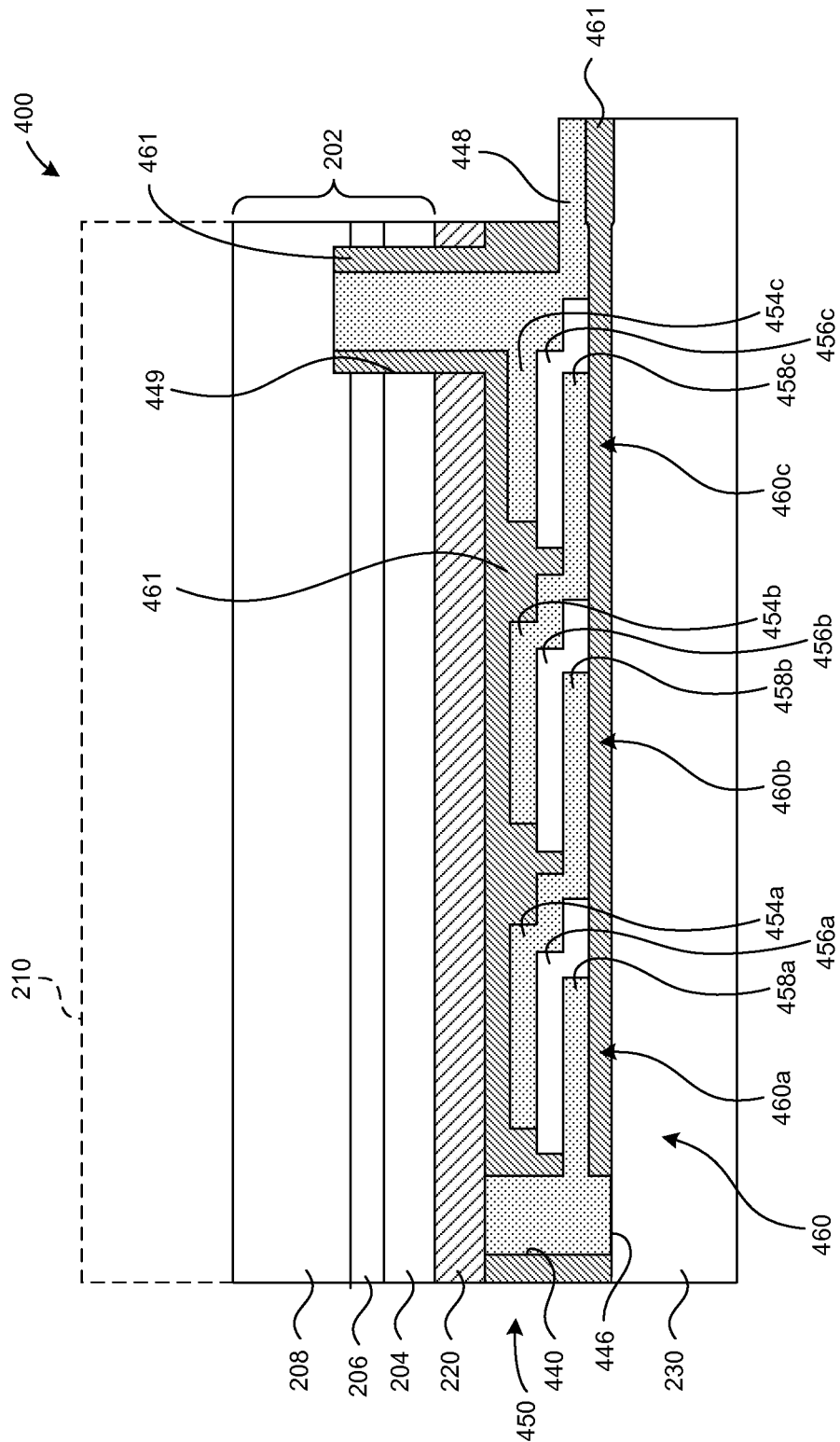
FIG. 4 is a cross-sectional view of an SSL device having an electrostatic discharge device configured and integrated in accordance with embodiments of the presently disclosed technology.

FIG. 4 is a cross-sectional view of an SSL device 400 having an electrostatic discharge device 450 configured in accordance with further embodiments of the present technology. The SSL device 400 can have several features generally similar to those described above with reference to FIGS. 2-3G. For example, the SSL device 400 can include an SSE 202 that in turn includes a first semiconductor material 204 (e.g., a p-type material), a second semiconductor material 208 (e.g., an n-type material), and an active region 206 between the first and second semiconductor materials 204, 208. The SSL device 400 can further include a reflective material 220 between the support substrate 230 and the SSE 202. Typically, the SSE 202 and the reflective/conductive material 220 are formed on an epitaxial substrate 210 (shown in dashed lines in FIG. 4). The structures that form the electrostatic discharge device 450 and that electrically connect the electrostatic discharge device 450 to the SSE can be formed on the SSE 202 while the SSE 202 is supported by the epitaxial substrate 210. The epitaxial substrate 210 can then be removed.

In the illustrated embodiment, the electrostatic discharge device 450 is fabricated on the SSE 202, and both the SSE 202 and the electrostatic discharge device 450 are carried by the substrate 230, with the electrostatic discharge device 450 positioned between the substrate 230 and the SSE 202. Typically, the fabrication steps for forming the electrostatic discharge device 450 are performed while the SSE 202 is inverted from the orientation shown in FIG. 4, and before the substrate 230 is attached. The electrostatic discharge device 450 can include a plurality of electrostatic junctions 460 (identified individually as first-third junctions 460a-460c). Each electrostatic junction 460 can include a first conductive material 454 (identified individually by reference numbers 454a-454c), an intermediate material 456 (identified individually by reference numbers 456a-456c), and a second conductive material 458 (identified individually by reference numbers 458a-458c). The materials can be disposed using any of a variety of suitable deposition, masking, and/or etching processes. These materials can be different than the materials forming the SSE 202 because they are not required to perform a light emitting function. As noted above and as will be understood by one of ordinary skill in the art, these techniques can be used to sequentially form the illustrated layers on the SSE 202 while the SSL 400 is inverted relative to the orientation shown in FIG. 4. One or more insulating materials 461 electrically isolates the layers from the first semiconductor material 204 and/or from the support substrate 230.

The intermediate material 456 can have electrical properties different than those of the first conductive material 454 and the second conductive material 458. In some embodiments, the intermediate material 456 can be a semiconductor (e.g., amorphous silicon) or a metal. The first conductive material 454a of one junction (e.g., the first junction 460a) is electrically coupled to the second conductive material 458b of an adjacent junction (e.g., the second junction 460b). While the illustrated electrostatic discharge device 450 includes three junctions 460 placed in series, in further embodiments more or fewer junctions 460 can be used. Furthermore, to obtain different current-handling capacities for the electrostatic discharge device 450, the junctions 460 can be altered in size, and/or multiple junctions 460 can be arranged in parallel.

The electrostatic discharge device 450 can further include a first contact 448 positioned at a first via 449 and electrically connected between one of the junctions 460 (e.g., to the first metal layer 454c of the third junction 460c), and to the second semiconductor material 208. The electrostatic discharge device 450 additionally includes a second contact 446 positioned at a second via 440 extending through the electrostatic discharge device 450. The second contact 446 electrically couples a junction 460 (e.g., the second metal layer 458a of the first junction 460a) to the reflective material 220 or, in further embodiments, to a separate conductive layer or to the first semiconductor material 204. The substrate 230 can be conductive so as to route current to the second contact 446. An insulating material 461 electrically isolates the first and second contacts 446, 448 from adjacent structures.

In some embodiments, components of the electrostatic discharge device 450 are deposited on the SSE 202 by PVD, ALD, plating, or other techniques known in the semiconductor fabrication arts. The first and second vias 449 and 440 can be formed in the electrostatic discharge device 450 and/or the SSE 202 using the methods described above with reference to FIG. 3E. In a representative embodiment, the electrostatic discharge device 450 is formed on the SSE 202 before the substrate 230 is attached. In some embodiments, the electrostatic discharge device 450 can be attached to the substrate and/or the SSE 202 by means of bonding layers. In still further embodiments, the electrostatic discharge device 450 can be positioned on a portion of an external surface of the SSE 202 without the substrate 230.

Figure 5A:
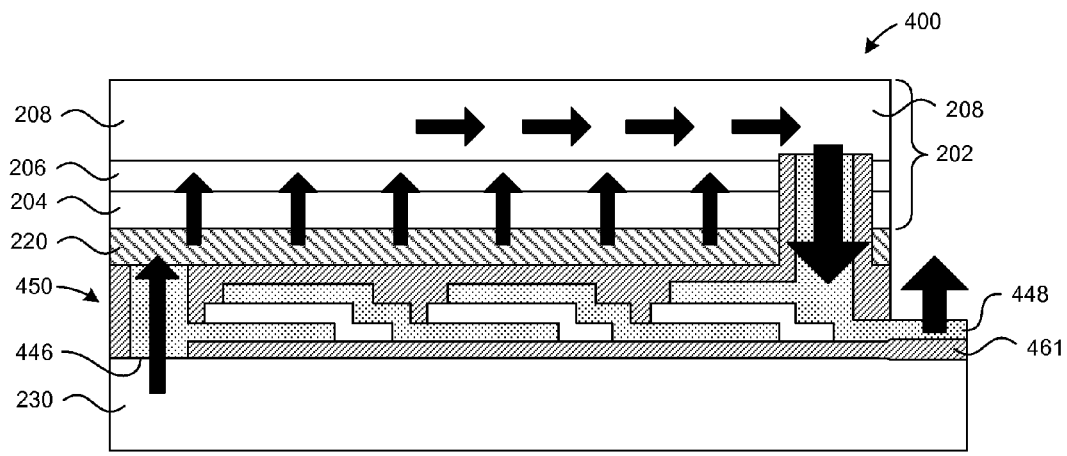
FIGS. 5A and 5B are cross-sectional views of the SSL device of FIG. 4 during operation in accordance with embodiments of the presently disclosed technology.
Figure 5B:
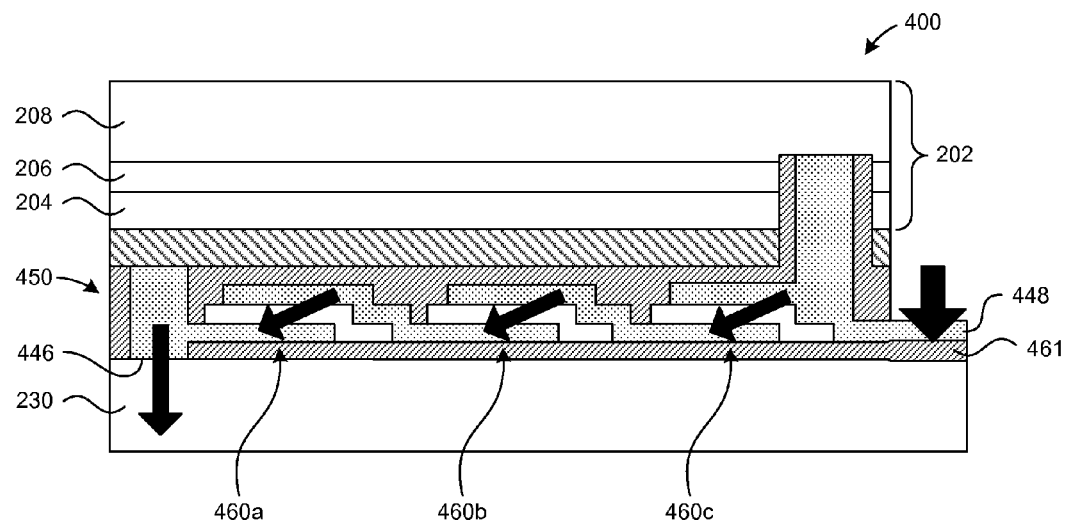

FIGS. 5A and 5B are cross-sectional views of the SSL device 400 of FIG. 4 during operation in accordance with embodiments of the technology. During normal operation, as illustrated in FIG. 5A, current flows in the direction of the arrows from the second contact 446 to the first semiconductor material 204, through the SSE 202 to the second semiconductor material 208 as described above, to the first contact 448. As illustrated in FIG. 5B, during an electrostatic discharge event, the SSL device 400 can be protected from reverse currents by providing a path for reverse current flow, illustrated by the arrows, through the junctions 460. The reverse current can be directed through the substrate 230, rather than through the SSE 202.

One feature of several of the embodiments described above is that the solid state emitter and associated electrostatic discharge device can be formed so as to be integral. For example, the electrostatic discharge device can be formed from a portion of the same substrate on which the solid state emitter components are formed, as described above with reference to FIGS. 2-3G. In the embodiments described with reference to FIGS. 4 and 5, the same epitaxial substrate is not used for both the solid state emitter and the electrostatic discharge device, but, the components that form the electrostatic discharge device can be formed in situ on the solid state emitter. An advantage of the latter approach is that the electrostatic discharge device can be formed so as to be on the side of the solid state emitter opposite from the path of light emitted by the solid state emitter. Accordingly, the presence of the electrostatic discharge device does not interfere with the ability of the solid state emitter to emit light or other radiation.

In any of the foregoing embodiments, the integrally formed electrostatic discharge device and solid state emitter can share integrally formed contacts. In particular, the same contacts of the solid state lighting device provide electrical current to both the solid state emitter and the electrostatic discharge device. The contacts can be the only externally accessible active electrical contacts for both the solid state emitter and the electrostatic discharge device. As a result, the manufacturer need not separately electrically connect the electrostatic discharge device to the solid state emitter, but can instead form the electrical contacts simultaneously with forming the electrostatic discharge device itself. In any of these embodiments, a single substrate or support member can carry both the solid state emitter and the electrostatic discharge device. The electrostatic discharge device is not a pre-formed structure and is accordingly not attachable to or removable from the solid state emitter as a unit, without damaging or rendering inoperable the solid state emitter. In addition, the solid state emitter and the electrostatic discharge device are not separately addressable. That is, electrical current provided to the solid state emitter will also be provided to the electrostatic discharge device. The solid state emitter and the electrostatic discharge device are accordingly formed as a single chip or die, rather than being formed as two separate dies that may be electrically connected together in a single package.

From the foregoing, it will be appreciated that specific embodiments of the technology have been described herein for purposes of illustration, but that various modifications may be made without deviating from the disclosure. For example, some of the embodiments described above discuss the electrostatic discharge device as a diode. In other embodiments, the electrostatic discharge device can include a different, non-linear circuit element. The electrostatic discharge device can be constructed and connected to protect the SSE from large reverse voltages, as discussed above in particular embodiments. In other embodiments, the electrostatic discharge device can be connected with a forward bias to prevent the SSE from large forward voltages. In still further embodiments, the SSE can be connected to both types of ESD devices, to protect against both high forward and high reverse voltages. Additionally, in certain embodiments, there may be more or fewer electrostatic discharge devices, or electrostatic junctions within an electrostatic discharge device, for a particular SSL device. Furthermore, material choices for the SSE and substrates can vary in different embodiments of the disclosure. In certain embodiments, the ESD devices can be used to protect solid state transducers other than the light emitting transducers described above. Certain elements of one embodiment may be combined with other embodiments, in addition to or in lieu of the elements of the other embodiments. Accordingly, the disclosure can encompass other embodiments not expressly shown or described herein.

We claim:

1. A solid state transducer system, comprising:
a solid state emitter; and
an electrostatic discharge device carried by the solid state emitter, the electrostatic discharge device and the solid state emitter having a shared first contact and a shared second contact, with the first and second contacts being the only externally accessible active electrical contacts for both the solid state emitter and the electrostatic discharge device,
wherein the solid state emitter is grown from an epitaxial substrate, and wherein the electrostatic discharge device comprises a portion of the epitaxial substrate.

2. The system of claim 1, further comprising:
a power source operably connected to the first contact; and
a controller operably connected to the power source, the controller configured to start and stop current from the power source to the first contact.

3. The system of claim 1 wherein the solid state emitter and the electrostatic discharge device together form a single die.

4. The system of claim 1 wherein the electrostatic discharge device comprises a semiconductor junction.

5. A solid state transducer system, comprising:
a solid state emitter; and
an electrostatic discharge device carried by the solid state emitter, the electrostatic discharge device and the solid state emitter having a shared first contact and a shared second contact, with the first and second contacts being the only externally accessible active electrical contacts for both the solid state emitter and the electrostatic discharge device, wherein the electrostatic discharge device includes at least a portion of an epitaxial substrate; and
a via in the epitaxial substrate, wherein the first contact is connected to the solid state emitter with the via.

6. The system of claim 5 wherein the electrostatic discharge device comprises a diode connected between the first contact and the second contact.

7. The system of claim 5 wherein the electrostatic discharge device comprises a semiconductor junction.

8. The system of claim 5 wherein the solid state emitter is positioned between the electrostatic discharge device and the substrate.

9. The system of claim 5, further comprising:
a power source operably connected to the first contact; and
a controller operably connected to the power source, the controller configured to start and stop current from the power source to the first contact.

10. The system of claim 5 wherein the solid state emitter and the electrostatic discharge device together form a single die.

11. The system of claim 5 wherein the electrostatic discharge device is connected in parallel with the solid state emitter.

12. A solid state transducer device, comprising:
a single support substrate;
a solid state emitter carried by the single support substrate; and
an electrostatic discharge device carried by the single support substrate, the electrostatic discharge device and the solid state emitter sharing a common first contact and a common second contact, neither the electrostatic discharge device nor the solid state emitter having another support substrate connected between the single support substrate and either the electrostatic device or the solid state emitter,
wherein the solid state emitter is positioned between the electrostatic discharge device and the substrate.

13. The device of claim 12 wherein the electrostatic discharge device comprises a diode connected between the first contact and the second contact.

14. The device of claim 12 wherein the single support substrate includes an epitaxial substrate on which the solid state emitter is epitaxially formed.

15. The device of claim 12 wherein the electrostatic discharge device is connected in parallel with the solid state emitter.

16. A solid state transducer device, comprising:
a single support substrate;
a solid state emitter carried by the single support substrate;
an electrostatic discharge device carried by the single support substrate, the electrostatic discharge device and the solid state emitter sharing a common first contact and a common second contact, neither the electrostatic discharge device nor the solid state emitter having another support substrate connected between the single support substrate and either the electrostatic device or the solid state emitter, wherein the electrostatic discharge device includes at least a portion of an epitaxial substrate; and
a via in the epitaxial substrate, wherein the first contact is connected to the solid state emitter with the via.

* * * * *

UNITED STATES PATENT AND TRADEMARK OFFICE
CERTIFICATE OF CORRECTION

PATENT NO.        : 8,809,897 B2                                    Page 1 of 1
APPLICATION NO.   : 13/223098
DATED             : August 19, 2014
INVENTOR(S)       : Odnoblyudov et al.

It is certified that error appears in the above-identified patent and that said Letters Patent is hereby corrected as shown below:

In the Claims

Column 9, line 30, Claim 5, delete "emitter; and" and insert -- emitter; --, therefor.

Signed and Sealed this
Twenty-eighth Day of October, 2014

Michelle K. Lee
*Deputy Director of the United States Patent and Trademark Office*